United States Patent [19]
Guillou et al.

[11] 3,988,605
[45] Oct. 26, 1976

[54] PROCESSORS FOR THE FAST TRANSFORMATION OF DATA

[75] Inventors: Rene F. Guillou, Rennes; Yves F. Fouche, Saint-Jacques-de-la Lande, both of France

[73] Assignee: Etat Francais, France

[22] Filed: Feb. 12, 1975

[21] Appl. No.: 549,309

[30] Foreign Application Priority Data
Feb. 25, 1974  France .................................. 74.06264

[52] U.S. Cl. ................................................ 235/156
[51] Int. Cl.² ........................................ G06F 15/34
[58] Field of Search ...................... 235/152, 156

[56] References Cited
UNITED STATES PATENTS

| | | |
|---|---|---|
| 3,714,566 | 1/1973 | Kang .............................. 235/156 X |
| 3,742,201 | 6/1973 | Groginsky ........................ 235/156 |
| 3,754,128 | 8/1973 | Corinthios ........................ 235/156 |
| 3,879,605 | 4/1975 | Carl et al. ....................... 235/156 |

*Primary Examiner*—Jerry Smith
*Attorney, Agent, or Firm*—Larson, Taylor and Hinds

[57] ABSTRACT

A process is disclosed for the rapid transformation of numerical or analog data wherein an ordered pair of real numbers ($a_i$, $a_j$) is biunequivocally associated with the ordered pair of two real numbers ($m$, D), where m is equal to the smaller of the numbers $a_i$ and $a_j$ and D is equal to the alegebraic difference $a_i - a_j$. The inverse process is also disclosed wherein the ordered pair of real numbers (m, D) is associated with the ordered pair of real numbers ($a_i$, $a_j$), where $a_i$ is equal to the sum m + D and $a_j$ is equal to m, when D is positive, and where $a_i$ is equal to m and $a_j$ is equal to the alegebraic differences $M - D$, when D is negative or zero.

6 Claims, 8 Drawing Figures

PROCESSORS FOR THE FAST TRANSFORMATION OF DATA

FIELD OF THE INVENTION

The present invention concerns a process for the rapid transformation of numerical or analog data.

BACKGROUND OF THE INVENTION

Since the publication of an article entitled "An Algorithm for the Machine Calculation of Complex Fourier Series" by J. W. Cooley and J. W. Tukey in April of 1965 in *Mathematics of Computation* vol. 19, pages 297–301, there has been a resurgence in the interest in certain transformations, viz., linear orthogonal transformations wherein the matrices belong to the class of so-called "Good" matrices which can be used in fast algorithms (See "The Interaction Algorithm and Practical Fourier Analysis", published in the *Journal of the Royal Statistical Society* by I. J. Good, vol. B-20, 1958, pages 361 to 371). These transformations include the Haar transformation, reference being made to the article "A Generalized Technique for Spectral Analysis", published by M. C. Andrews and K. L. Caspary in "*I.E.E.E. Transations on Computers*", vol. C19, no. 1, January 1970, pages 16 to 25, and "Two-Dimensional Digital Filtering With Haar and Walsh Transform", published by D. Gubbins, I. Scollar and P. Wisskirchen, in *Annales Geophysiques*, vol. 27, no. 2, April, May, June 1972. These transformations are used to process data, to provide filtering of these data, making use of the order that certain linear orthogonal transformations, in particular, the Haar transformation, imposes on apparently random data.

SUMMARY OF THE INVENTION

An object of the present invention concerns the provision of a transformation process that can effect a transformation, which is commutable to the inverse transformation, providing further advantages in addition to those of the known transformations mentioned above.

In order better to understand the present invention, it is noted that in the known Haar transformation, in analogy to $R^2$, where a vector of components $x$ and $y$ can be represented by the ordered pair $(x,y)$, two numbers S and D are made to correspond to the pair $(a_1, a_2)$, these numbers representing the algebraic sum and difference of $a_1$ and $a_2$, or, as expressed using matrices:

$$\begin{bmatrix} S \\ D \end{bmatrix} = \begin{bmatrix} 1 & 1 \\ 1 & -1 \end{bmatrix} \begin{bmatrix} a_1 \\ a_2 \end{bmatrix} \quad \text{or} \quad \begin{bmatrix} D \\ S \end{bmatrix} = \begin{bmatrix} 1 & -1 \\ 1 & 1 \end{bmatrix} \begin{bmatrix} a_1 \\ a_2 \end{bmatrix}$$

In terms of orthogonal transformations, it is necessary to develop the inverse transformation $H^{-1}$ of the H transformation to find $a_1$ and $a_2$ from their sum S and their difference D, namely:

$$\begin{bmatrix} a_1 \\ a_2 \end{bmatrix} = 1/2 \begin{bmatrix} 1 & 1 \\ 1 & -1 \end{bmatrix} \begin{bmatrix} S \\ D \end{bmatrix} \quad \begin{bmatrix} a_1 \\ a_2 \end{bmatrix} = 1/2 \begin{bmatrix} 1 & 1 \\ 1 & -1 \end{bmatrix} \begin{bmatrix} D \\ S \end{bmatrix}$$

From H and $H^{-1}$, we can imagine the mechanism of the fast algorithms associated with certain matrices. The overall transformation of $[R^N$, in $[R^N$ that they describe, can be reduced to the succession of a small number of elementary transformations, which are commutable to the inverse, using simple arithmetical operations such as the addition and subtraction of two numbers, followed, in certain instances, by multiplication by constant terms. The Haar transformation of N numbers, written $x_i$, where $i = 1, N$ and $N = 2^n$, into N numbers written $z_i$ is illustrated in drawings discussed hereinbelow, as are the inverse transformation of N numbers written $z_i$ into numbers written $x_i$.

A further feature of the present invention concerns the provision of a transformation processor which is of the type discussed above, but which is simplified as compared thereto, and affords new advantages insofar as the structure of the transformed numbers is concerned. Thus, according to the present invention, a processor is provided for transformation of real numbers wherein a pair of real numbers $(a_i, a_j)$ is associated, as one-to-one "biunequivalents i.e., in a one to one correspondence", with a pair of two real numbers $(m, D)$, where $m$ is equal to the smaller of the numbers $a_i$ and $a_j$ and D is equal to the algebraic difference $a_i - a_j$, and an inverse transformation processor wherein the pair of two real numbers $(m, D)$ is associated with two real numbers $(a_i, a_j)$ where, when D is positive, $a_i$ is equal to the sum $m + D$ and $a_j$ to $m$, and when D is negative or zero, $a_i$ is equal to $m$, and $a_j$ to the algebraic difference $m - D$.

According to another feature of the invention, a processor of transformation for N numbers, written $a_i$, where $i = 1, N$ and $N = 2^n$, is provided into N numbers written $c_i$, in which transformation processor, in accordance with a first phase, each pair of successive $a_i$ numbers is transformed, according to the above, into a first number $m$ and a first number D, the said first numbers $m$ being arranged in the same way as the initial pairs to obtain a first set of N/2 $m$ numbers, and the first D numbers being arranged in the same way as the initial pairs to obtain a first set of N/2 D numbers, and then, in accordance with a second phase, each pair of successive $m$ numbers of the first set of $m$ numbers is transformed, by the same process as above, into a second $m$ number and a second D number, the second $m$ numbers being arranged in the same way as the pairs of the first set of $m$ numbers, to obtain a second set of N/4 $m$ numbers and the second D numbers being arranged in the same way as the pairs of the first set of D numbers to obtain a second set of N/4 D numbers, and so on, until the $n^{th}$ phase where the $n^{th}$ set of $m$ numbers, which contains only a single number, is placed at the head, followed by the number of the $n^{th}$ set of D numbers and then numbers of the $(n-1)^{th}$ set of D numbers and so on to the numbers of the first set of D numbers, to obtain the $c_i$ numbers.

According to another feature, a processor is provided for inverse transformation of the above, i.e., wherein N numbers written $c_i$, where $i = 1, N$ and $N = 2^n$, are transformed into N numbers written $a_i$, in which, in accordance with a first phase, the first and second $c_i$ numbers are transformed according to the above-mentioned inverse process into a second set of two $m$ numbers, and than in the course of a second phase, the first $m$ number of the first set and the third $c_i$ number are transformed, according to the same inverse process, as well as the second $m$ number of the first set and the fourth $c_i$ number to form a second set of four $m$ numbers, and so on up to the $n^{th}$ operation in the course of which the first $m$ number of the $(n-1)^{th}$ set and the $N/2 + 1)^{th}$ $c_i$ number are transformed, as well as the pair formed by the second $m$ number of the $(n-1)^{th}$ set and the $(N/2 + 2)^{th}$ $c_i$ number, the pair formed by the third $m$ number of the $(n-1)^{th}$ set and the $(N/2 + 3)^{th}$ $c_i$ number, and so on to the $(N/2)^{th}$ pair, to arrive at the set of transformed $a_i$ numbers.

According to another feature, a processor is provided, for transformation of N × P numbers written $a_i^k$, where $i = 1, N$; $k = 1, P$; $N = 2^n$; and $P = 2^p$, into N × P numbers written $c_i^k$, the $a_i^k$ numbers being respectively displayed as standard or classic matrices of N rows and P columns in which each column of $a_i^k$ numbers is transformed by the above direct transformation processor into a row of $d_k^i$ numbers, the rows of $d_k^i$ numbers being arranged as a matrix of P rows and N columns, and then each column of $d_k^i$ numbers is transformed by the above direct transformation processor to a row of $c_i^k$ numbers.

According to yet another feature of the invention, an inverse tranformation processor is provided, of N × P numbers written $c_i^k$, where $i = 1, N$; $k = 1, P$; $N = 2^n$; and $P = 2^p$, into N × P numbers written $a_i^k$, the $c_i^k$ and $a_i^k$ numbers being respectively arranged as classic matrices of N rows and P columns, in which each row of $c_i^k$ numbers is transformed according to the above inverse transformation processor into a column of $d_k^i$ numbers, the $d_k^i$ number columns being arranged as a matrix of P rows and N columns, whereafter each row of $d_k^i$ numbers is transformed according to the above inverse transformation processor into a column of $a_i^k$ numbers.

Other features and advantages of the present invention will be set forth in or evident from reading the description of specific examples of transformation processors according to the invention found hereinbelow.

DESCRIPTION OF THE PREFERRED EMBODIMENTS

Figure 1:
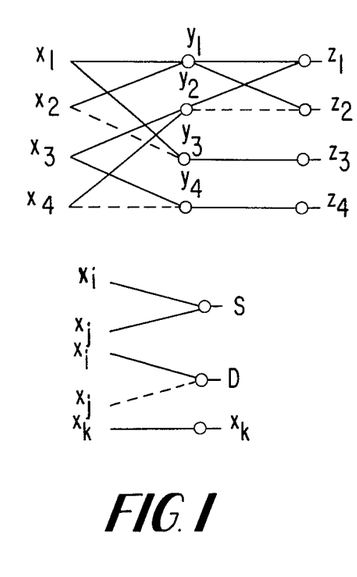
FIG. 1 is a diagram representing a conventional direct Haar transformation.

Referring to FIG. 1, a graph or diagram is shown which illustrates the direct Haar transformation of four numbers $x_1$ to $x_4$ into four numbers $z_1$ to $z_4$. In the lower portion of FIG. 1 values are indicated that correspond to the "arrival" nodes of the upper graph. Thus, $S = x_i + x_j$ is indicated by two directed or oriented line segments in solid lines converging toward a node, $D = x_i - x_j$ is indicated by an oriented line segment in solid lines converging with an oriented line segment in dashed lines toward a node, and $x_k = x_k$ indicated by a single line segment in a solid line ending at a node. Referring to the graph itself, it can be seen, for example, that $y_1 = x_1 + x_2$, that $z_2 = y_1 - y_2$ etc. It is noted that $z_1$ is equal to the sum $x_1 + x_2 + x_3 + x_4$, which means that, for an unaltered precision of the results, if numbers $x_1$ to $x_4$ are represented, according to binary coding, by $p$ bits, there have to be $p + 2$ bits to represent $z_1$ (or more generally $P + \log_2 N$ bits if there are N x numbers). Moreover, since the three other transforemed numbers $z_2$ to $z_4$ correspond to algebraic differences, a supplementary sign bit has to be furnished.

Figure 2:
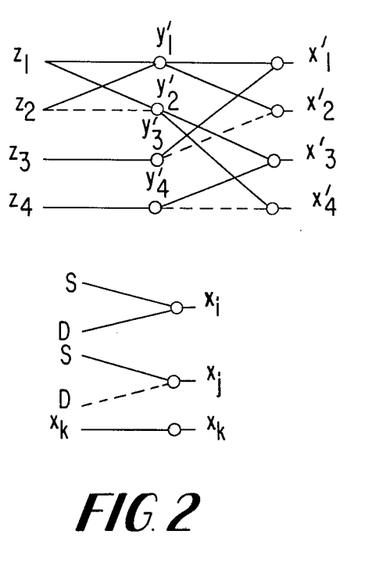
FIG. 2 is a diagram representing a conventional inverse Haar transformation.

Referring to FIG. 2, a graph is shown which illustrates the first part of the Haar inverse transformation of four numbers $z_1$ to $z_4$ in order to obtain first the numbers $x'_1$ to $x'_4$. In the lower part of FIG. 2, below the graph, there is also indicated the values at the arrival nodes of the graph. Thus $x'_1 = (S + D)$ is indicated by two oriented solid line segments ending at a node, $x'_j = (S - D)$ is indicated by an oriented segment in solid lines converging with a dashed line oriented segment at a node, and $x'_k = x'_k$ is indicated as in FIG. 1 by a single solid line segment ending in a node. In the graph itself, it can be seen that, for example, $y'_2 = z_1 - z_2$, that $x'_3 = y'_2 + y'_4 = y'_4$ etc. Thus, at each node there has to be an addition or subtraction. However, the required calculations for restoring the initial values are not complete. In the case where $N = 2^2$ for example, the matrix of the Haar transformtion can be written as follows:

$$[H] = [D][R]$$

where H is the following conventional orthonormal matrix:

$$[H] = 1/2 \begin{bmatrix} 1 & 1 & 1 & 1 \\ 1 & 1 & -1 & -1 \\ \sqrt{2} & -\sqrt{2} & 0 & 0 \\ 0 & 0 & \sqrt{2} & -\sqrt{2} \end{bmatrix}$$

where D is the following diagonal matrix:

$$[D] = \begin{bmatrix} 1/2 & 0 & 0 & 0 \\ 0 & 1/2 & 0 & 0 \\ 0 & 0 & \sqrt{2}/2 & 0 \\ 0 & 0 & 0 & -\sqrt{2}/2 \end{bmatrix}$$

and where R is the following non-orthonormal matrix:

$$[R] = \begin{bmatrix} 1 & 1 & 1 & 1 \\ 1 & 1 & -1 & -1 \end{bmatrix}$$

$$\begin{bmatrix} 1 & -1 & 0 & 0 \\ 0 & 0 & 1 & -1 \end{bmatrix}$$

It should be noted that the graphs of FIGS. 1 and 2 only correspond to calculations of R and its transpose respectively. Computations must still be made for normalizing with D, which is generally done only at the end for reasons of precision. These latter calculations involve multiplication and division, the number of operations increasing with N.

Figure 3:
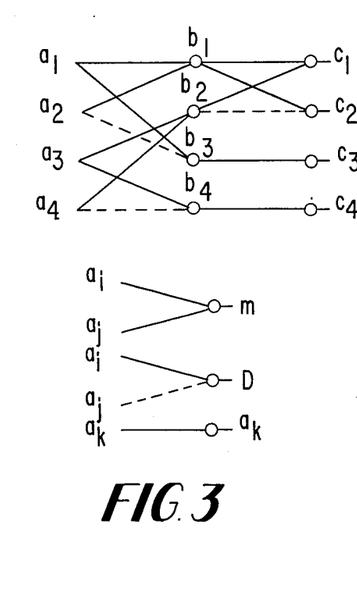
FIG. 3 is a diagram representing a direct transformation according to the invention.

Referring to FIG. 3, a graph is shown which illustrates direct transformation process, according to the invention, of four positive numbers $a_1$ to $a_4$, these numbers being transformed into four numbers $c_1$ to $c_4$. In the lower part of FIG. 3, below the graph, there are indicated the values corresponding to the arrival nodes of the graph. Thus, $m$ is equal to the smaller of two numbers $a_i$ and $a_j$, indicated by two solid line segments ending at a node, $D = a_i - a_j$, shown, as in the direct Haar transformation, by an oriented line segment in solid lines converging with an oriented lined segment in dashed lines toward a node, and $a_k = a_k$ indicated by a single line segment in solid lines ending at a node. Referring to the graph itself, it can be seen, for example, that $b_3 = a_1 - a_2$, that $c_1$ is equal to the minimum of $b_1$ and $b_2$ etc. It is noted that $c_1$ is equal to the smallest of numbers $a_1$ to $a_4$ and hence can be represented with the same number of bits that these numbers can. On the other hand, the other three transformed numbers correspond to algebraic differences, and hence a supplementary sign bit must be supplied.

Using the term "dynamics" to refer to the area between the smallest possible number and the largest possible number expressed, for example, for a set of positive numbers the smallest of which may be zero, by the number of binary bits needed to represent the largest number of the set, a first advantage of the invention will be considered. This will be done by comparing, for a set of numbers with equal dynamics to be transformed, the dynamics of the transformed numbers according to the Haar process and the dynamics of the transformed numbers that are obtained by the process of the invention. In the process of the invention, the dynamics of the transformed numbers, taking the sign into account, is twice that of the original numbers. On the other hand, with the Haar process, it is equal to N times that of the original numbers, N being the number thereof. Although, thus far it has been assumed that the original numbers are positive, it can readily be demonstrated that the conclusion is the same whether these numbers are positive or negative. It is also to be observed that, in FIGS. 1 to 3, the last two transformed numbers, $z_3$ and $z_4$, on the one hand, and $c_3$ and $c_4$, on the other hand, are respectively equal. As to the second terms $z_2$ and $c_2$, it is readily seen that their dynamics are practically the same as those of the first terms. In a more general form, it appears that the "dynamics" of the N/2 first transformed numbers is less according to the process of the invention than according to the Haar transformation, and that the N/2 last transformed numbers are equal. It is also noted that the "dynamics" of the N/2 first numbers in the process of the invention is independent of N.

Referring to Table I below, which was developed using pseudo-random $a_i$ numbers obtained with use of a uniform law on 0.31 (real numbers rounded off to the nearest integer) illustrates the conclusions stated above. In Table I, $c_i$ represents the numbers transformed according to the invention and $z_i$ those transformed by the Haar process.

Figure 4:
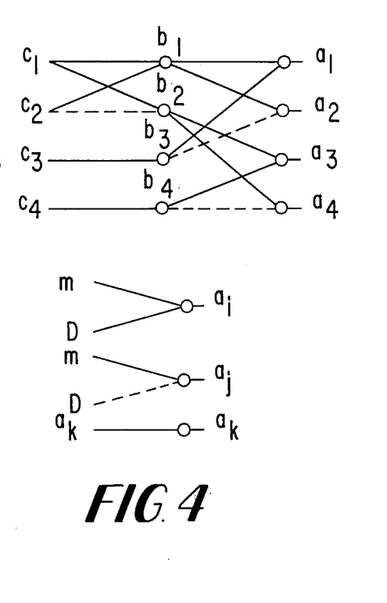
FIG. 4 is a diagram representing an inverse transformation according to the invention.

Referring to FIG. 4, the graph shown illustrates the inverse transformation according to the invention, of four numbers $c_1$ to $c_4$ so as to restore the numbers $a_1$ to $a_4$. The portion of FIG. 4 below the graph indicates the values that correspond to the arrival nodes of the graph. Thus $a_i$ is equal to $m + D$ if $D > 0$ or to $m$ if $D \leq 0$, indicated by two directed or oriented solid line segments ending at a node, $a_j$ is equal to $m$ if $D > 0$ or to $m - D$ if $D \leq 0$, indicated by an oriented segment in solid line converging with an oriented line segment in dashed lines at a node, and $a_k = a_k$, indicated by a single solid line segment ending in a node. It is important to note that the operations to be effected are then complete. Contrary to the Haar transformation process, there are no normalizing calculation to be performed which, of course, is a very great advantage, particularly when the transformations are to be done in real time, because the required computations are shorter.

TABLE I

| | | | | | | | | | | | | | | | | | |
|---|---|---|---|---|---|---|---|---|---|---|---|---|---|---|---|---|---|
| N = 2 | $a_i$ | 25 | 12 | | | | | | | | | | | | | | |
| | $c_i$ | 12 | 13 | | | | | | | | | | | | | | |
| | $z_i$ | 37 | 13 | | | | | | | | | | | | | | |
| N = 4 | $a_i$ | 7 | 4 | 24 | 8 | | | | | | | | | | | | |
| | $c_i$ | 4 | −4 | 3 | 16 | | | | | | | | | | | | |
| | $z_i$ | 43 | −21 | 3 | 16 | | | | | | | | | | | | |
| N = 8 | $a_i$ | 10 | 17 | 19 | 2 | 20 | 7 | 21 | 0 | | | | | | | | |
| | $c_{ci}$ | 0 | 2 | 8 | 7 | −7 | 17 | 13 | 21 | | | | | | | | |
| | $z_i$ | 96 | 0 | 6 | 6 | −7 | 17 | 13 | 21 | | | | | | | | |
| N = 16 | $a_i$ | 8 | 9 | 26 | 4 | 30 | 11 | 15 | 18 | 25 | 11 | 2 | 28 | 23 | 19 | 11 | 24 |
| | $c_i$ | 2 | 2 | −7 | −9 | 4 | −4 | 9 | 8 | −1 | 22 | 19 | −3 | 14 | −26 | 4 | −13 |
| | $z_i$ | 264 | −22 | −27 | −11 | −13 | 9 | 6 | 7 | −1 | 22 | 19 | −3 | 14 | −26 | 4 | −13 |

An elemenatry electronic circuit will now be described which is capable of producing the numbers $m$ and D at the outputs thereof when the numbers $a_i$ and $a_j$ are applied to the inputs. In terms of logical equations, this circuit, which is illustrated in FIG. 5, effects the two following operations:

$$m = a_i \text{ and } \overline{\text{sign of } (a_i - a_j)} \text{ or } a_j \text{ and } \overline{\text{sign of } (a_i - a_j)} \quad (1)$$

$$D = a_i - a_j \quad (2)$$

Figure 5:
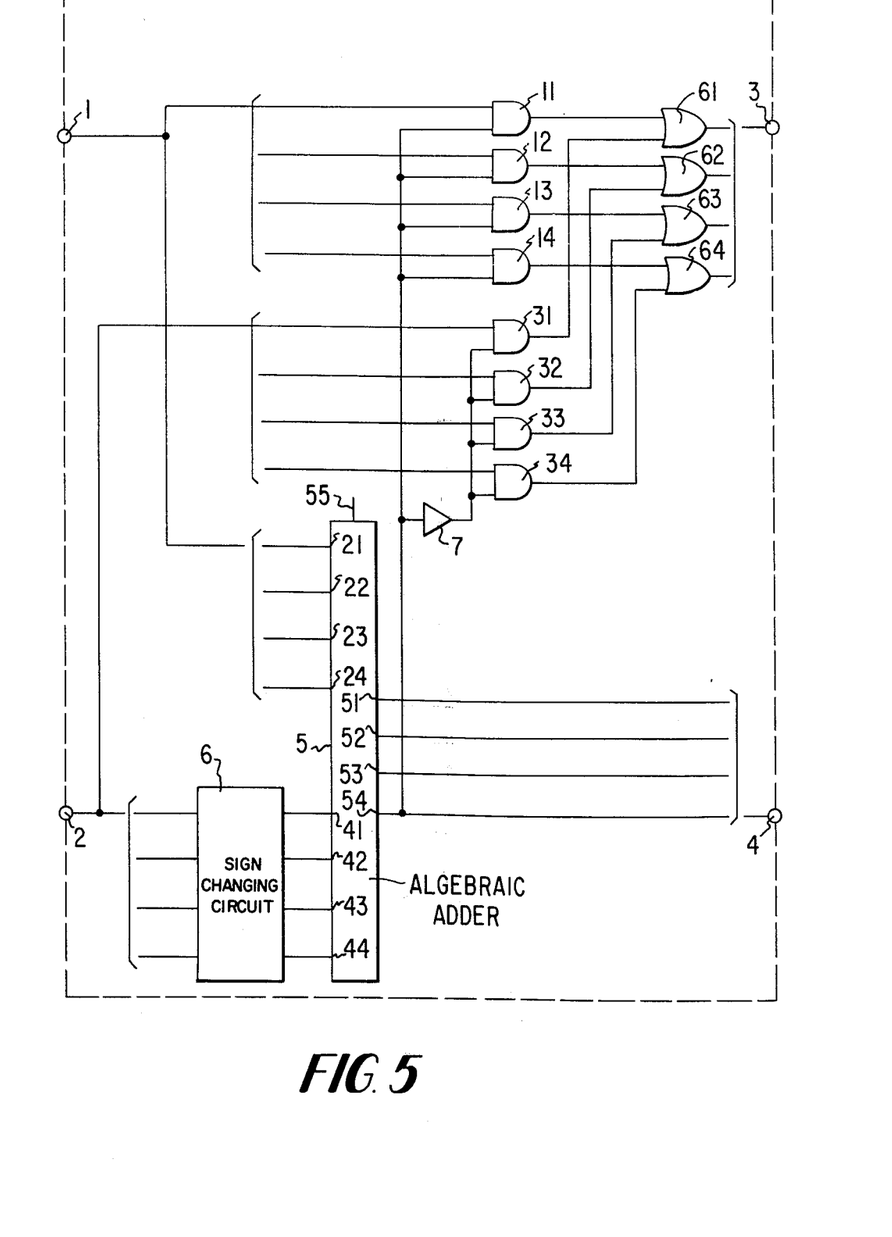
FIG. 5 is a schematic circuit diagram of an elementary circuit for the production of the direct transformation of the invention.

The circuit of FIG. 5 comprises two input terminals 1 and 2 and two output terminals 3 and 4. Each of these terminals are multiple. Thus terminal 1 actually represents, in the described example, four terminals connected to four leads, thus permitting the parallel transmission of the four bits of a binary number. The leads of terminals 1 are respectively connected, on the one hand, to the four first inputs of a series of AND gates 11 to 14 and, on the other hand, to inputs 21 to 24 of an algebraic adder 5. The leads of terminals 2 are respectively connected, on the one hand, to the first inputs of AND gates 31 to 34 and, on the other hand, to the inputs of a sign changer circuit 6, whose outputs are respectively connected to inputs 41 to 44 of adder 5. Outputs 51 to 54 of adder 5 are respectively connected to terminals 4. Outputs 54 is connected to the input of an inverter 7 as well as to the second inputs of AND gates 11 to 14. The output of inverter 7 is connected to the second inputs of AND gates 31 to 34. The outputs of AND gates 11 to 14 are respectively connected to the first inputs of OR gates 61 to 64 while the outputs of AND gates 31 to 34 are respectively connected to the second inputs of OR gates 61 to 64. The outputs of OR gates 61 to 64 are connected to terminals 3. Output 55 of adder 5 is connected to another adder circuit (not shown) so as to accommodate spillover, if necessary.

Adder circuit 5 is an algebraic adder, such as is manufactured commercially in integrated circuit form, e.g, the SN 7493 circuit manufactured by Texas Instruments. Adder 5 produces, at its outputs 51 to 55, the algebraic sum of two algebraic numbers, one of which is applied in binary form with an appropriate sign to inputs 21 to 24 and the other of which is applied to inputs 41 to 44. The sign changer circuit 6 produces at its output the "complement to 2" of the number applied to its input. It is assumed in the following discussion that the negative numbers are presented by "complements to 2" of the corresponding positive numbers. Another convention could, of course, be chosen and one of ordinary skill in the art could consequently readily modify circuit 5 and circuit 6 to accommodate such a change, the general make-up of the transformation system of FIG. 5 being otherwise unmodified. In the embodiment of FIG. 5, it is assumed that the numbers $a_i$ and $a_j$, respectively applied to terminals 1 and 2, are represented by four binary bits, one bit being a sign bit.

The operation of the circuit of FIG. 5 will now be considered. The four bits of number $a_i$ are applied to terminals 1, from whence they are transmitted to the inputs of gates 11 to 14. Of these bits, the bit transmitted to AND gate 14 is the sign bit, the one transmitted to gate 13 is the most heavily weighted bit, that transmitted to gate 12 is the bit with the next lowest weight, and that transmitted to gate 11 is the bit with the lowest weight. The $a_j$ bits are also transmitted in the same order to inputs 21 to 24, the sign bit being applied to input 24 of adder 5. The four bits of the number $a_j$ are applied to terminals 2, from whence they are transmitted to the inputs of sign changer circuit 6, which delivers at its output "the complement to 2" of $a_j$, i.e., $-a_j$ or $\bar{a}_j$. The $\bar{a}_j$ bits are applied to inputs 41 to 44 of adder 5, the sign bit being applied to terminal 44 and so on. Adder 5 delivers, at its output, the number $D = a_i + \bar{a}_j = a_i - a_j$. It will be appreciated that given the fact that an algebraic subtraction of any algebraic numbers can be expressed by the addition of the absolute values of the numbers, a carry forward or carrying operation can be provided by an adder (not illustrated) similar to adder 5, based on the overrun or spillover signal transmitted by output 55. The four bits delivered by adder 5 to outputs 51 to 54 are applied to terminals 4, as would be those of the additional similar adders referred to above. Output 54, which delivers the bit sign of D, is also connected to the inputs of gates 11 to 14. The four $a_j$ bits are also transmitted, in the order indicated above, to the inputs of AND gates 31 to 34. Output 54 is also connected to the input of inverter 7, which inverts the sign bit for D, the inverted output being applied to the second inputs of AND gates 31 to 34.

Thus, if we assume that numbers $a_i$ and $a_j$ are positive and that $a_i > a_j$, we know that $D > O$, i.e., the sign bit for D delivered by 54 is a O. This signal cannot therefore open gates 11 to 14. However, the signal inverted by inverter 7 can open gates 31 to 34 so as to transmit the number $a_j$ to terminals 3 through OR gates 61 to 64. This operation is in agreement with the logical equation (1) set forth above, the terminals 3 delivering the number m. It can be seen that the operation of the circuit of FIG. 5 corresponds to logical operations of equation (1), no matter what the sign of $a_i$ and $a_j$ may be.

Figure 6:
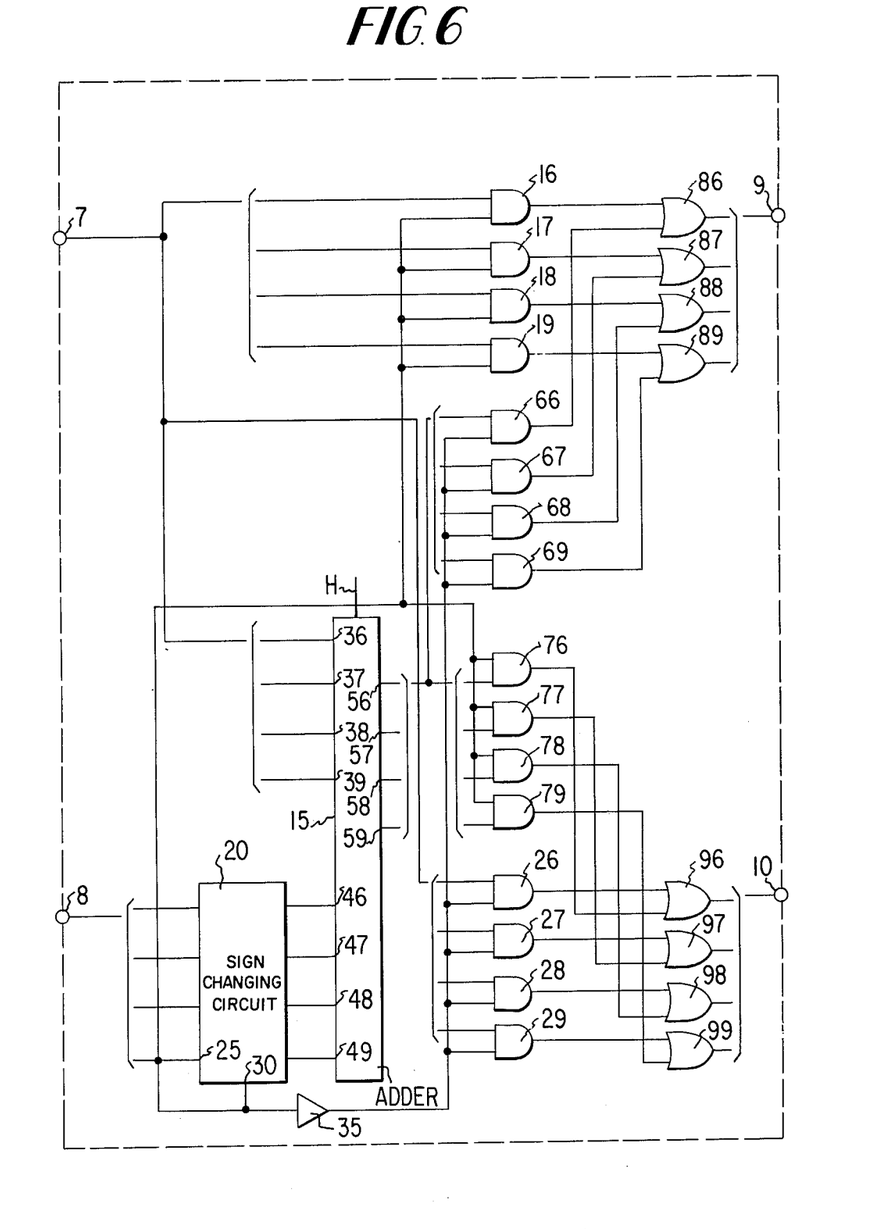
FIG. 6 is a schematic circuit diagram of an elementary circuit for the production of the inverse transformation of the invention.

Referring to FIG. 6, elementary electronic circuit is shown which is capable of delivering, at its output, the numbers $a_j$ and $a_j$ when m and D are applied to its inputs. In the form of logical equations, this circuit effects the two following operations:

$$a_i = m \text{ and } D \text{ or } (m + D) \text{ and } \overline{D \text{ sign}} \qquad (3)$$

$$a_j = (m - D) \text{ and } D \text{ sign or } m \text{ and } \overline{D.\text{sign}} \qquad (4)$$

The circuit of FIG. 6 includes two input terminals 7 and 8 and two output terminals 9 and 10. As in FIG. 5, each of these terminals is multiple. The output leads of terminal 7 are respectively connected to the first inputs of AND gates 16 to 19, to the first inputs of AND gates 26 to 29 and to inputs 36 to 39 of adder 15 Terminal 8 is connected to the inputs of a sign changer circuit 20 the outputs of which are connected to the inputs 46 to 49 of the adder 15. Outputs 56 to 59 of adder 15 are connected to the first inputs of gates 66 to 69 as well as to the first inputs of AND gates 76 to 79. It will be understood that the series of four leads of FIG. 6 is arranged in the same order as those of FIG. 5. In particular, the output lead transmitting the number sign applied to terminal 8 is connected to input 25 of circuit 20 as well as to the command input 30 of this circuit. This lead is also connected to the second inputs of AND gates 16 to 19, to the second inputs of AND gates 76 to 79 and to the input of an inverter 35. The output of inverter 35 is connected to the second inputs of AND gates 66 to 69 and to the second inputs of AND gates 26 to 29. The outputs of AND gates 16 to 19 are respectively connected to the first inputs of OR gates 86 to 89 while the outputs of AND gates 66 to 69 are respectively connected to the second inputs of OR gates 86 to 89. The outputs of AND gates 26 to 29 are respectively connected to the first inputs of OR gates 96 to 99. The outputs of AND gates 76 to 79 are respectively connected to the second inputs of OR gates 96 to 99 and the ouputs of OR gates 86 to 89 are connected to the output terminals 9. Finally, the outputs of OR gates 96 to 99 are connected to output terminals 10.

The adder circuit 15 is an algebraic adder of the same type as circuit 5 of FIG. 5. Sign changer circuit 20 changes the sign of the number applied thereto and is also of the same type as circuit 6 of FIG. 5, although its function may be modified as a function of the signal applied to its command input 30. If the command signal is a logical 0, indicating that the sign of the number applied to terminal 8 is positive, circuit 20 does not change the sign of the number applied thereto. On the other hand, if the command signal is a logical 1, circuit 20 does change the sign of the number applied thereto, which is what happens when the number applied to terminal 8 is negative. Such a circuit is standard, commercially available item and hence the construction and operation will not be described in any further detail.

The operation of the circuit of FIG. 6 will now be considered. The four number m bits are applied to terminals 7, from whence they are transmitted to gates 16 to 19, to gates 26 to 29, and to the inputs 36 to 39 of adder 15. The four number D bits are applied to terminals 8, from whence they are transmitted to the inputs of circuit 20. Let us assume, first, that D is positive. Circuit 20 then allows passage of number D because its sign bit is a 0. Inverter 35 delivers a logical 1 that opens AND gates 66 to 69 as well as AND gates 26 to 29. Adder circuit 15 delivers at its output the sum $m + D$ which is applied to open gates 66 to 69 and hence is transmitted to OR gates 86 to 89 whose outputs are connected to terminal 9. Similarly, the number m is transmitted through open gates 26 to 29 to OR gates 96 to 99 and thence to terminal 10. Thus terminal 9 delivers output corresponding to the sum $m + D$ and terminal 10 delivers output corresponding to the number $m$, which is in conformity with equations (3) and (4) set forth above. Now let us assume that D is negative. Circuit 20 then changes the sign of D, to apply $-D$ to adder 15 via inputs 46 to 49. The D sign bit is a logical 1, $m$ opens both AND gates 16 to 19 and AND gates 76 to 79. Circuit 15 delivers at its output the difference $-D$ which is applied to OR gates 96 to 99, and hence to terminal 10, through AND gates 76 and 79, which are open. Moreover, the number $m$ is transmitted through open gates 16 to 19 to OR gates 86 to 89 and thence to terminal 9. Thus terminal 9 delivers an output corresponding to the number $m$ and terminal 10 delivers a output corresponding to the difference $m - D$, which again is in conformity with equations (3) and (4) above.

Figure 7:
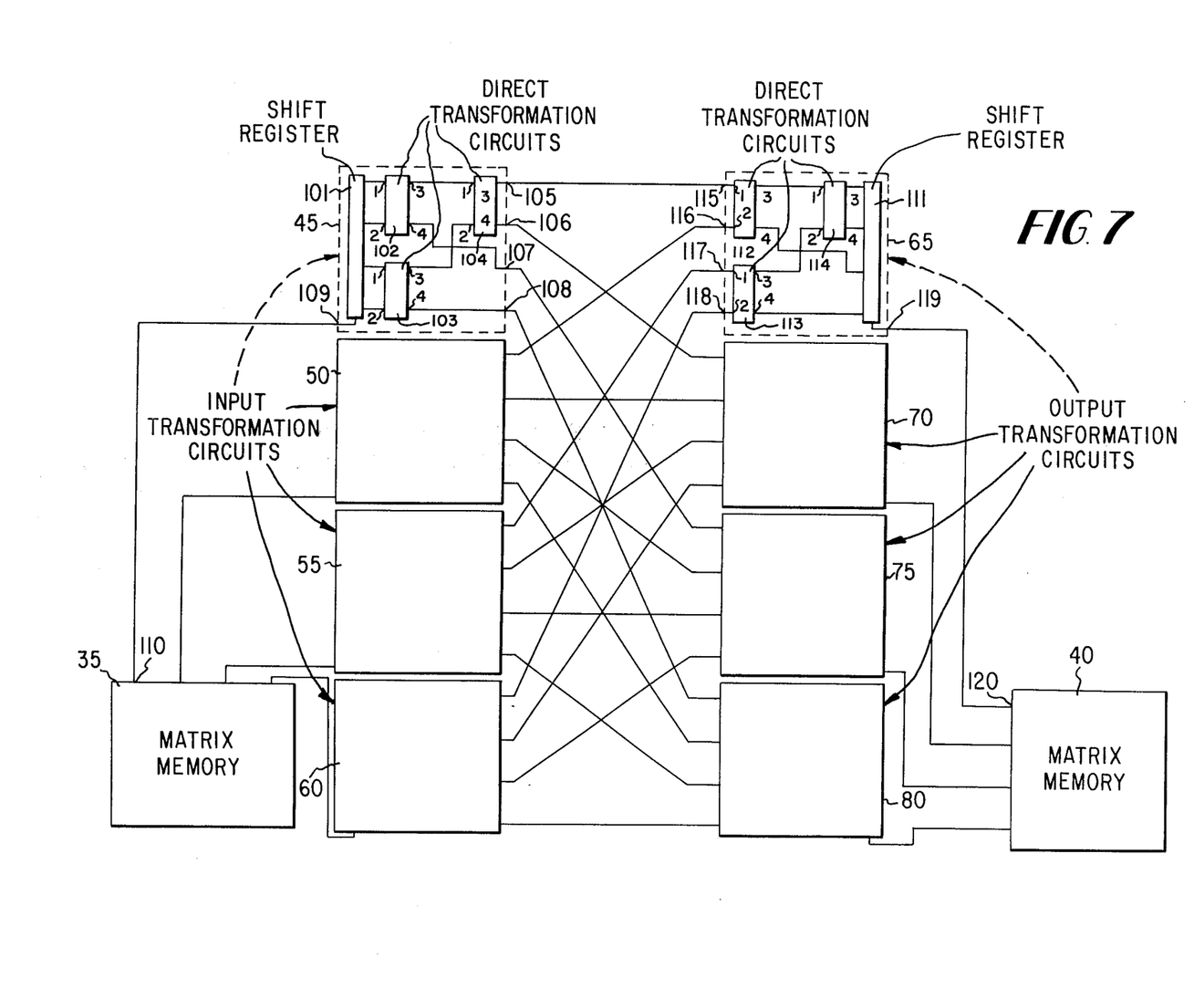
FIG. 7 is a circuit diagram of a direct transformation system which functions according to the process of the invention to transform a number matrix into a matrix of transformed numbers.

FIG. 7 represents a direct transformation system, which operates, according to the process of the invention, to transform a number matrix 35 into a matrix 40 of transformed numbers. Matrix 35 may be a memory in which the sixteen numbers $a_i^k$, $i = 1,4$ and $k = 1, 4$ are arranged in rows and columns. Although the usual input and output registers for memory 35 have not been shown, suitable circuitry would be provided to extract the numbers column by column from memory 35, and to transmit the numbers so extracted to appropriate shift registers. Memory 40, in the example under consideration, is a memory in which the sixteen numbers $c_i^k$, $i = 1, 4$ and $k = 1, 4$ are arranged in rows and columns, and it again being understood that suitable means (not shown) are provided to write the numbers, row by row, in memory 40, from appropriate shift registers.

The transformation system of FIG. 7 comprises four elementary input transformation circuits 45, 50, 55 and 60 and four elementary output transformation circuits 65, 70, 75 and 80, interconnected by a network of connecting links. Only the input transformation circuit 45 will be described in detail because the other circuits 50, 55 and 60 are identical. Similarly, only output transformation circuit 65 will be described because the other circuits 70, 75 and 80 are also identical.

The elementary input transformation circuit 45 comprises a shift register 101 and three circuits 102, 103 and 104 which are identical to the direct transformation circuit of FIG. 5. Thus, for these circuits, input terminals 1 and 2 and output terminals 3 and 4 have been indicated which correspond to, and perform the same role as the like-numbered terminals of the circuit of FIG. 5. Shift register 101 has four outputs each comprising as many leads as there are bits necessary to represent the numbers written in the register. As shown, the first output of 101 is connected to terminal 1 of 102, the second to terminal 2 of 102, the third to terminal 1 of 103, and the fourth to terminal 2 of 103. Terminal 3 of 102 is connected to terminal 1 of 104, and terminal 3 of 103 to terminal 2 of 104. Output 3 of 104 is connected to output 105 of 45, output 4 of 104 to output 106, output 4 of 102 to output 107 and output 4 of 103 to output 108. Finally, input 109 of circuit 45, which likewise constitutes the input of register 101, is connected to ouptut 110 of the first column of memory 35.

The elementary output transformation circuit 65 comprises a shift register 111 and three circuits 112, 113 and 114 which are also identical to the direct transformation circuit of FIG. 5. Again, the terminals 1 to 4 of these circuits correspond to those of the circuit of FIG. 5. Shift register 111 has four inputs which are analogous to the outputs of shift register 101. As shown, the first input of register 111 is connected to terminal 3 of circuit 114, the second to terminal 4 of circuit 114, the third to terminal 4 of circuit 112 and the fourth to terminal 4 of circuit 113. Further, circuits 112 to 114 are interconnected, in a manner similar to circuits 102 to 104. Terminal 1 of circuit 112 is connected to input terminal 115 of circuit 65, terminal 2 of circuit 112 to input terminal 116, terminal 1 of circuit 113 to input terminal 117, and terminal 2 of circuit 113 to input terminal 118. Output 119 of circuit 65, which is also the output of register 111, is connected to input 120 of the first row of memory 40.

The links that connect the outputs of circuits 45, 50, 55 and 60 to the inputs of circuits 65, 70, 75 and 80 effect a transformation of columns to rows in a well known manner.

The operation of the transformation system of FIG. 7 will now be considered. The numbers stored in memory 35 are transmitted, column by column, into the shift registers of circuits 45, 50, 55, and 60, such as register 101 for circuit 45. Thus, considering circuit 45 as exemplary, the numbers $a_1^1$, $a_2^1$, $a_3^1$ and $a_4^1$ are received by register 101. Once the transfer process has been terminated, the numbers $a_1^1$ and $a_2^1$ are applied to inputs 1 and 2 of circuit 102 whereas the numbers $a_3^1$, $a_4^1$ are applied to inputs 1 and 2 of circuit 103. Outputs 3 and 4 of circuit 102 thus deliver the $m'$ numbers according to the equation (1) set forth above, and the D' numbers according to equation (2). Similarly, the outputs 3 and 4 of 103 deliver the $m''$ and $D''$ numbers as a function of $a_3^1$ and $a_4^1$. The numbers D' and D'' are respectively applied directly to the output terminals 107 and 108. The numbers m' and m'' are respectively applied to inputs 1 and 2 of circuit 104 which delivers at its outputs the m' numbers that represent the smallest of numbers $a_1^1$ to $a_4^1$ and $D^1 = m' - m''$. Similar operations are effected in circuits 50, 55, 60 so that, at a given instant, all of the numbers are present at the outputs of these circuis. The network of links then effects the column to row transformation referred to above so that the numbers $m^1$ to $m^4$ are applied to the respective inputs of circuit 65, numbers $D^1$ to $D^4$ to the inputs of circuit 70, numbers $D'^1$ to $D'^4$ to inputs of circuit 75 and $D''^1$ to $D''^4$ to the inputs of circuit 80. In circuit 65, as well as in corresponding circuits 70, 75 and 80, the direct transformation circuits 112 to 114 effect the same calculations as circuits 102 to 104. Thus, register 111 of circuit 65 contains a first term $c_1^1$ which represents the smallest of all the terms of matrix 35, and a second term $c_1^2$ that represents the difference between the smallest terms of the first two and last two columns respectively. The contents of register 111 is written in the first row of memory 40, that of register for circuit 70 in the second row of 40 and so on. Thus, memory 40 will contain the transformed numbers $c_1^1$ to $c_4^4$ arranged in rows and in columns. As will be seen from examples to be considered below, these numbers have particular properties.

Figure 8:
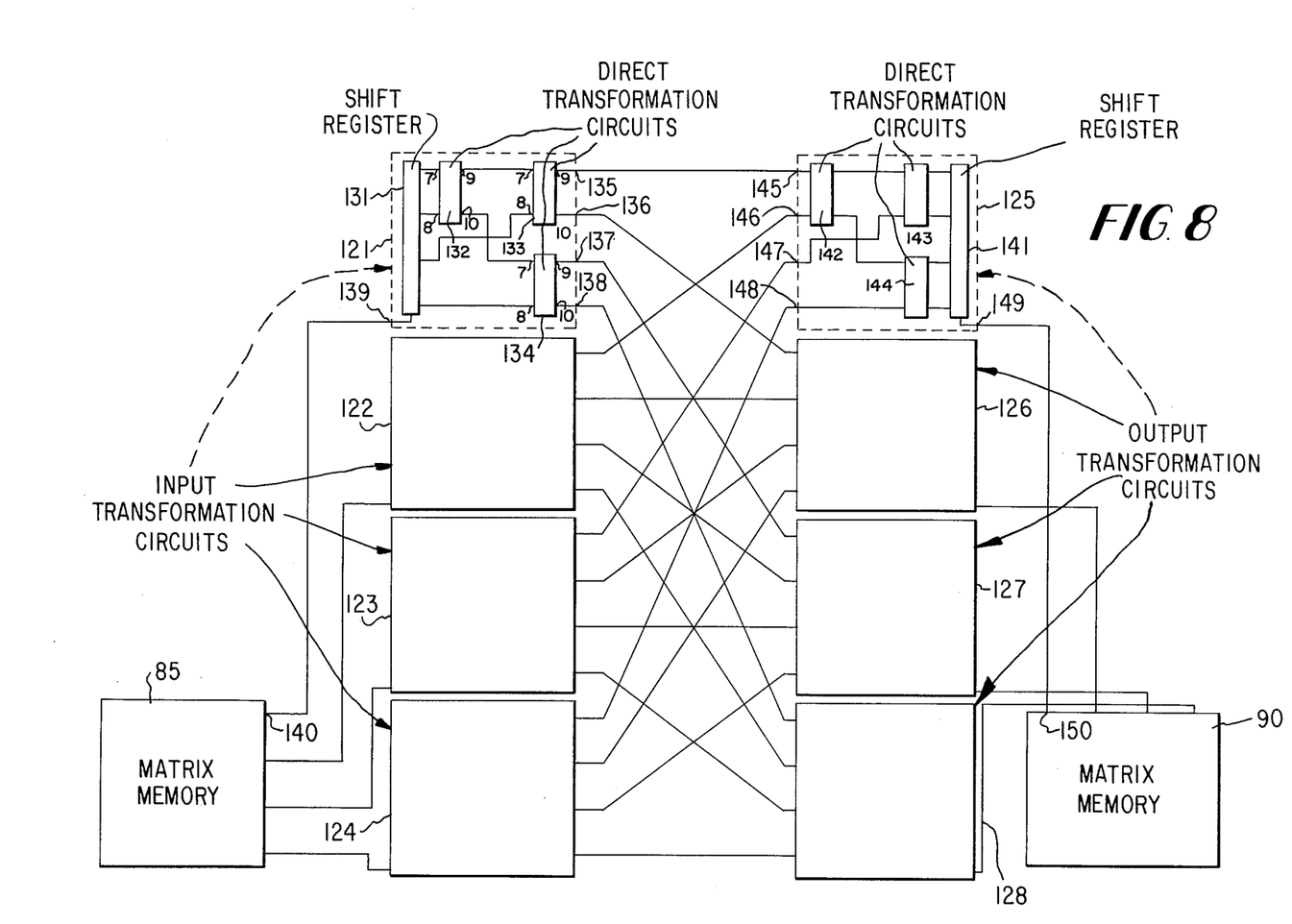
FIG. 8 is a circuit diagram of an inverse transformation processor which functions according to the invention to transform a matrix of transformed numbers into a matrix of original numbers.

Referring to FIG. 8, an inverse transformtion system is shown which operates, according to the process of the invention, to transform a matrix of numbers stored in memory 85, into a matrix, of inverse transformed numbers stored in a memory 90. The matrix stored in memory 85 is analogous to that stored in memory 40, and the matrix stored in memory 90 to that stored in memory 35. The transformation system of FIG. 8 comprises four other elementary input transformation circuits 121 and 124, and four elementary output transformation circuits 125 to 128, which are respectively connected by a network of connecting links as shown. Only input circuit 121 and output circuit 125 will be described in detail, the other input circuits being identical to circuit 121 and the other output circuits being identical to output circuit 125.

The elementary input transformation circuit 121 comprises a shift register 131 and three circuits 132, 133 and 134 which are identical to the inverse transformation circuit of FIG. 6. Thus, input terminals 7 and 8, and output terminals 9 and 10 are indicated which precisely correspond to the like-numbered terminals in the circuit of FIG. 6. Register 131 is analogous to register 101 of FIG. 7 and it has its first output connected to input 7 of circuit 132, its second output connected to input 8 of circuit 132, its third output connected to input 8 of circuit 133, and its fourth output to input 8 of circuit 134. Output 9 of circuit 132 is connected to input 7 of circuit 133 while its output 10 is connected to input 7 of circuit 134. Outputs 9 and 10 of 133 are respectively connected to output terminals 135 and 136 of circuit 121 while the outputs 9 and 10 of circuit 134 are respectively connected to output terminals 137 and 138. Input terminal 139 of circuit 121 which is also the input of register 131, is connected to output 140 of the first row of memory 85.

The elementary output transformation circuit 125 comprises a shift register 141 and three circuits 142, 143 and 144 which are identical to the inverse transformation circuit of FIG. 6. Again, terminals 7 to 10 are indicated for these circuits which correspond to those discussed previously. Shift register 141 has four inputs analogous to the outputs of 131. The first input of 141 is connected to terminal 9 of circuit 143, the second terminal 10 of circuit 143, the third to terminal 9 of circuit 144 and the fourth to terminal 10 of circuit 144. Circuits 142 to 144 are interconnected, as shown, in a manner similar to circuits 132 to 134. Terminal 7 of circuit 142 is connected to input 145 of circuit 125, terminal 8 of circuit 142 to input 146, terminal 8 of circuit 143 to input 147 and terminal 8 of 144 to input 148. Output terminal 149 of circuit 125, which is also the input of 141, is connected to input 150 of the first column of memory 90.

The links that connect the outputs of circuits 121 to 124 to the inputs of circuits 125 to 128 serve to effect, in a well known manner, a transformation of rows into columns. This network of connecting links is identical to that of FIG. 7, because square matrices of numbers are being considered.

The operation of the transformation system of FIG. 8 is very similar to that of the transformation system of FIG. 7, with the obvious exception of the processing provided by the transformation circuits 121 to 128. Considering the operation of circuit 121, the shift register 131 contains the numbers $c_1^1$, $c_1^2$, $c_1^3$, $c_1^4$. Numbers $c_1^1$ and $c_1^2$ are applied to inputs 7 and 8 of circuit 132 while $c_1^3$ is applied to input 8 of circuit 133 and $c_1^4$ to input 8 of circuit 134. The outputs 9 and 10 of circuit 132 produce two numbers $m'$ and $m''$, $m'$ being applid to input 7 of circuit 133 and $m''$ to input 7 of circuit 134. Thus, circuit 121 delivers, on its outputs 135 to 138, the numbers $m^1$ to $m^4$. Circuits 122 to 124 operate in an identical manner in order to obtain the numbers $D^1$ to $D^4$, $D'^1$ to $D'^4$, and $D''^1$ to $D''^4$. The network of links effects the row to column transformation referred to above so that $m^1$, $D^1$, $D'^1$ and $D''^1$ are applied to the inputs 145 to 148 of circuit 125, and so on. Circuit 125 is then operated to write in register 141 the numbers $a_1^1$, $a_2^1$, $a_3^1$ and $a_4^1$ before transferring these numbers to memory 90 through input terminal 150.

It should be noted that in the above description no hypothesis was made as to synchronization, or more generally, as to the time durations of the operations that are effected, or the delay or transit times of the signals of the systems of FIG. 7, and FIG. 8. In a first form of synchronization of the operations in question, a clock is provided which defines, (1) a first phase $P_1$ comprising four elementary times $P_1^1$ to $P_1^4$ where each elementary time corresponds to the transfer of a row from memory 35 to the corresponding shift registers; (2) a second phase $P_2$ comprising three elementary times $P_2^1$ to $P_2^3$, wherein $P_2^1$ corresponds to the reading of register 101, $P_2^2$ to computation in circuits 102 and 103, and $P_2^3$ to the computation in circuit 104; (3) a third phase $P_3$ comprising three elementary times $P_3^1$ to $P_3^3$, wherein $P_3^1$ corresponds to the computation in circuits 112 and 113, $P_3^2$ to the computation in circuit 114 and $P_3^3$ to writing of the numbers in shift register 111; and (4) a fourth phase $P_4$ comprising four elementary times $P_4^1$ to $P_4^4$ where each elementary time corresponds to the transfer of the content of a shift register to a row of memory 40. In the operation of the system of FIG. 8, analogous phases can be provided in practice.

In the foregoing discussion, it was assumed that circuits 45, 50, 55 and 60 functioned in parallel, i.e., during the same phase $P_2$ above. It will be appreciated that it is also possible to provide only a single circuit instead of the four discussed, this single circuit being used four times, at different instances in time, to effect the necessary computations. In considering the first stage of the calculations, we would have the following time phases:

A first phase $Q^1$ comprising the five elementary times:

$q_1^1$, transfer of the first column of memory 35 into register 101, $q_2^1$, reading of register 101,
$q_3^1$, computation in circuits 102 and 103,
$q_4^1$, computation in circuit 104,
$q_5^1$, transfer of the output values into the first column of a buffer memory (not shown);
a second phase $Q^2$ comprising the five elementary times:
$q_1^2$, transfer of the second column of memory 35 into register 101,
$q_2^1 = q_2^1, q_3^2 = q_3^1, q_4^2 = q_4^1$,
$q_5^2$, transfer of the output valus into the second column of the buffer memory (not shown);
a third phase $Q^3$ which is readily deduced from the previous ones; and
a fourth phase $Q^4$ which is also readily deduced from the previous ones.

The second stage of the computations will be effected in the following way:

A first phase $R^1$ comprising the five elementary times: $r_1^1$, transfer of the first row from the buffer memory into register 101,
$r_2^1$, reading of register 101,
$r_3^1$, computation in circuits 102 and 103,
$r_4^1$, computation in circuits 104,
$r_5^1$, transfer of output values to the first row of memory 40; and
three further phases, $R^2$, $R^3$ and $R^4$ which are directly deduced from the foregoing.

It may be noted that although three memories are provided in the above process, i.e., memories 35 and 40, as well as the buffer memory, only one memory is strictly necessary. Further, if necessary, a buffer register can be provided at the output of 45, to serve a function analogous to that of register 101.

In practice, synchronization could be selected as a function of the speed of computation of the circuits that are used. Thus, in real time, it may be preferable to provide several circuits working in parallel to gain time. On the other hand, if the time for performing the transformation is not limited, the number of circuits used can be reduced by doing the computations in succession.

Table II found hereinbelow shows, in Part I thereof, a listing of numbers to be transformed, which listing corresponds to altitudes of a topographic survey expressed in meters. The next part, Part II, of Table II shows the numbers obtained by the transformation process of the invention, and the last part, Part III, the numbers obtained by the Haar process.

It is noted that, in accordance with the process of the invention, the number that has the greatest absolute value is the first number in the listing for Part II, i.e., 296 which represents a minimum altitude. All the other absolute values comprise only two decimal figures. In contrast, in accordance with the Haar process, the corresponding number in the listing in Part III is 94366, so that there are two decimal places more than required by the number 296. Further, the absolute values may comprise four decimal figures, which is, again, two more than required with the process of the invention. It is thus evident that the memory or the bandwidth needed to store or transmit the transformed numbers according to the invention can be very much reduced, as compared with the Haar process. In particular, it is possible to provide a special coding for the first term 296, and code all of the other numbers in the same way. In the Haar process this would lead to a loss of time because some of the terms comprise only two figures, which would poorly fill a code provided for four figure values present in the listing.

TABLE II

PART I
Table of Numbers to be Transformed

| 363 | 368 | 370 | 368 | 368 | 360 | 355 | 347 | 360 | 375 | 380 | 384 | 384 | 382 | 376 | 350 |
|---|---|---|---|---|---|---|---|---|---|---|---|---|---|---|---|
| 370 | 374 | 364 | 360 | 362 | 353 | 360 | 363 | 363 | 377 | 384 | 387 | 388 | 383 | 360 | 330 |
| 380 | 376 | 376 | 368 | 350 | 356 | 359 | 373 | 376 | 378 | 387 | 393 | 392 | 380 | 340 | 326 |
| 385 | 380 | 369 | 357 | 366 | 368 | 368 | 377 | 384 | 385 | 392 | 398 | 388 | 370 | 350 | 334 |
| 385 | 370 | 360 | 370 | 375 | 373 | 378 | 378 | 387 | 396 | 400 | 395 | 378 | 363 | 343 | 335 |
| 376 | 365 | 369 | 377 | 383 | 382 | 392 | 390 | 395 | 404 | 395 | 380 | 365 | 355 | 341 | 331 |
| 370 | 375 | 380 | 384 | 391 | 393 | 402 | 405 | 406 | 395 | 383 | 370 | 362 | 351 | 338 | 337 |
| 370 | 387 | 392 | 388 | 398 | 405 | 410 | 405 | 393 | 378 | 370 | 364 | 356 | 343 | 341 | 338 |
| 382 | 390 | 402 | 390 | 405 | 412 | 406 | 394 | 381 | 368 | 357 | 354 | 347 | 337 | 341 | 320 |
| 398 | 406 | 408 | 406 | 415 | 415 | 390 | 378 | 368 | 366 | 355 | 342 | 337 | 328 | 337 | 305 |
| 406 | 414 | 417 | 420 | 418 | 410 | 386 | 376 | 371 | 355 | 350 | 335 | 332 | 325 | 336 | 303 |
| 406 | 415 | 416 | 408 | 405 | 397 | 380 | 369 | 362 | 354 | 332 | 332 | 318 | 302 | 297 | 303 |
| 413 | 416 | 404 | 388 | 384 | 375 | 369 | 355 | 356 | 350 | 380 | 310 | 305 | 297 | 310 | 330 |
| 421 | 416 | 395 | 382 | 373 | 367 | 357 | 352 | 335 | 345 | 315 | 299 | 296 | 307 | 375 | 386 |
| 421 | 406 | 387 | 375 | 365 | 360 | 357 | 352 | 350 | 306 | 296 | 301 | 307 | 330 | 387 | 397 |
| 425 | 405 | 386 | 380 | 371 | 363 | 355 | 355 | 345 | 304 | 301 | 298 | 330 | 380 | 397 | 406 |

PART II
Table of Numbers Transformed According to the Process of the Invention

| 296 | 51 | 10 | 0 | 6 | 3 | 8 | −1 | −2 | 3 | −3 | 8 | 31 | −2 | −1 | −6 |
|---|---|---|---|---|---|---|---|---|---|---|---|---|---|---|---|
| −26 | −49 | −11 | 2 | 1 | −10 | −41 | 23 | 6 | −8 | −8 | 5 | −46 | 8 | 14 | 18 |
| −31 | −4 | 18 | −22 | 6 | 6 | −37 | 32 | −10 | 17 | −5 | 8 | −24 | −10 | 1 | 7 |
| −31 | −4 | −48 | 54 | −46 | 20 | −7 | 32 | −16 | 1 | 3 | 8 | −23 | 2 | 17 | 14 |
| −26 | −10 | 9 | −12 | −12 | 23 | −7 | −8 | −9 | −8 | 15 | 22 | −13 | 2 | −16 | 16 |
| −27 | −21 | 7 | 0 | 10 | 7 | −22 | 15 | 16 | −6 | 4 | 3 | −24 | 9 | −3 | 9 |
| −24 | −26 | −24 | 4 | −6 | −9 | −4 | 17 | 0 | 4 | −15 | 1 | −6 | 13 | −7 | 38 |
| −77 | 69 | −8 | 67 | −15 | 7 | −11 | 44 | −19 | 2 | 1 | 2 | −51 | 18 | 22 | −10 |
| −16 | −12 | 9 | 0 | −13 | 22 | 1 | −20 | −1 | −2 | −1 | 11 | −1 | −1 | −3 | −4 |
| −16 | −6 | 11 | 2 | −12 | −7 | −3 | 14 | −1 | −4 | −4 | −5 | −1 | 0 | −6 | −2 |
| −14 | −6 | 5 | −10 | 14 | 5 | −13 | 6 | 4 | −2 | 1 | −2 | 0 | −10 | 5 | −2 |
| −12 | −9 | 0 | 9 | 0 | −4 | 7 | −8 | 12 | −8 | 5 | −8 | −4 | 7 | −2 | −2 |
| −16 | −18 | −6 | −2 | 0 | −26 | 0 | 5 | 0 | 10 | −7 | 0 | 11 | −10 | 1 | −11 |
| −1 | −1 | −7 | 1 | −2 | 7 | −2 | 14 | 1 | −11 | 0 | −1 | 8 | 15 | −9 | 39 |
| −65 | 57 | −11 | 70 | −14 | 5 | −6 | 55 | −8 | 3 | 3 | 9 | 16 | 54 | 19 | −9 |
| −50 | 44 | 1 | 45 | 1 | −3 | 7 | −40 | −5 | 6 | −3 | 5 | 3 | −8 | 27 | −1 |

TABLE II-continued

PART III
Table of Numbers Transformed According to the Haar Process

| 94366 | 3756 | 639 | 1069 | 218 | 225 | 349 | 118 | 8 | 74 | 40 | 55 | 96 | 135 | 52 | 138 |
|---|---|---|---|---|---|---|---|---|---|---|---|---|---|---|---|
| 1064 | −3222 | −837 | 739 | −134 | −383 | −369 | 822 | 0 | −58 | −34 | −83 | −144 | −95 | 120 | 78 |
| −417 | −713 | 385 | −364 | 86 | 41 | −204 | 132 | −4 | 44 | 15 | −22 | −40 | −58 | −12 | 64 |
| 929 | 491 | −482 | 863 | −276 | 92 | −23 | 520 | −70 | −28 | −19 | 21 | −42 | −53 | 118 | 130 |
| −113 | −93 | −5 | −156 | −38 | 55 | −13 | −59 | −18 | −14 | 25 | 28 | −26 | 5 | −23 | 26 |
| −94 | −370 | 84 | 48 | 62 | 10 | −73 | 53 | 48 | −18 | 12 | 0 | −44 | 1 | 1 | 14 |
| 190 | −282 | −194 | −36 | −10 | −40 | −18 | 8 | 1 | 9 | −23 | 3 | −9 | 1 | −4 | 26 |
| −35 | 243 | −4 | 517 | −32 | 26 | −27 | 44 | −33 | 11 | 2 | 14 | −89 | 88 | 70 | −12 |
| 12 | −26 | 9 | −43 | −27 | 34 | 2 | −41 | −1 | −2 | −1 | 11 | −1 | −1 | −3 | −4 |
| −61 | −3 | 50 | −21 | −27 | −15 | −5 | 32 | −1 | −4 | −4 | −5 | −1 | −0 | −6 | −2 |
| −14 | −76 | 41 | −23 | 30 | 9 | −36 | 15 | 4 | −2 | 1 | −2 | 0 | −10 | 5 | −2 |
| 4 | −114 | −1 | 39 | 4 | −11 | 11 | 18 | 12 | −8 | 5 | −8 | −4 | 7 | −2 | −2 |
| 32 | −102 | −73 | −9 | −10 | −45 | 1 | 0 | 0 | 10 | −7 | 0 | 11 | −10 | 1 | −11 |
| 158 | −56 | −27 | −45 | −14 | 13 | −11 | −2 | 1 | −11 | 0 | −1 | 8 | 15 | −9 | 39 |
| 21 | 61 | −27 | 224 | −23 | 4 | −50 | 120 | −8 | 3 | 3 | 9 | 16 | 54 | 19 | −9 |
| −104 | 70 | 3 | 39 | 1 | −8 | 9 | −54 | −5 | 6 | −3 | 5 | 3 | −8 | 27 | −1 |

A second point should also be noted. With the process of the invention, all the terms of the first column except 296 are negative. More elaborate computations would show that this is actually very likely to occur. A gain in quantity of data put into the memory, or transmitted, may be readily obtained, however, by simply neglecting the sign of these terms. A closer analysis of this table reveals still other advantages. For example, it would be possible to neglect many terms before going on to the inverse transformation, the numbers then obtained not differing substantially from the initial numbers. The numerical example of Table II is also very important because one finds similar distributions of numbers in coding of television images and their transmission, where the effort is made to save on the required bandwith.

In the exemplary embodiment described, namely with respect to FIGS. 7 and 8, it is assumed that the registers such as 101, 111, 131 and 141 were input series registers, but it is understood that input parallel registers could also be utilized. It should be further noted that in the above description, as well as in the claims, it would be possible to reverse the terms "row" and "column" without departing from the scope of the invention, the distinction between rows and columns of a matrix or table being made only for convenience of explanation.

It is also to be noted that the process of the invention is applied just as well to analog values as to values expressed digitally, with the obvious condition that analog circuits be selected that will perform the operations defined in equations (1) to (4).

Although the principles of the present invention have been described with reference to a specific exemplary embodiment, it is to be understood that this description was presented only by way of example and does not limit the scope of the invention.

We claim:

1. A straight transforming processor for transforming N signals $a_i$, wherein $i = 1$, N and $N = 2^n$, comprising first pairing means for arranging said N signals into N/2 first pairs of ordered signals, N/2 first straight transforming units for transforming said N/2 first pairs into N/2 pairs of first signals $(m, D)$, second pairing means for arranging N/2 first signals $(m)$ into N/4 second pairs of first signals $(m)$, first ordering means for ordering and storing N/2 first signals (D) into a first set of places, N/4 second straight transforming units for transforming said N/4 second pairs of first signals $(m)$ into N/4 pairs of second signals $(m,D)$, third pairing means for arranging N/4 second signals $(m)$ into N/8 third pairs of second signals $(m)$, second ordering means for ordering and storing N/4 second signals (D) into a second set of places, and so on, until the $n^{th}$ straight transforming unit for delivering a single pair of $n^{th}$ signals (m,D) an $n^{th}$ ordering means for ordering and storing $n^{th}$ signal (D) into a $n^{th}$ set of a single place, and $n+1^{th}$ ordering means for ordering and storing $n^{th}$ signal $(m)$ into a $n+1^{th}$ set of single place, and reading means for reading said $n+1$ sets of places, each either first, or second, . . . , or $n^{th}$ straight transforming unit processing an ordered pair of signals $(a_i, a_j)$ according to the following logic relations:

$$m = a_i \text{ and sign of } (a_i = a_j) \text{ or } a_j \text{ and } \overline{\text{sign of } (a_i - a_j)} \quad (1)$$

$$D = a_i - a_j \quad (2)$$

and delivering signals $(m, D)$.

2. A straight transforming processor according to claim 1, for transforming N × P signals $a_i^k$, where $i = 1$, N; $k = 1$, P; $N = 2^n$ and $P = 2^p$, into N × P signals $c_i^k$, comprising a first matrix memory of N rows and P columns wherein said N × P signals $a_i^k$ are stored, reading means for reading each column of signals $a_i^k$ from said first matrix memory and applying them to a straight processor delivering a row of signals $d_k^i$, ordering means for ordering said rows of signals $d_k^i$ into a second matrix memory of P rows and N columns, reading means for reading each column of signals $d_k^i$ from said second matrix memory and applying them to a straight transforming processor delivering a row of signals $c_i^k$, and ordering means for ordering said rows of signals $c_i^k$ into a third matrix memory of N rows and P columns.

3. A straight transforming processor according to claim 1, wherein at least one of said straight transforming units includes first and second inputs, said first input receiving the first signal of an initial ordered pair of signals and said second input receiving the second signal, both signals being pure binary code signals, said first input being connected to the first inputs of a first set of AND gates respectively and the first input of an algebraic adder, said second input being connected to the first inputs of a second set of AND gates respectively and the input of a sign changing circuit whose output is connected to the second input of said algebraic adder, the sign output of the algebraic adder being applied to second inputs of said first set of AND gates and through a logic inverter to second inputs of said second set of AND gates, both outputs of first and second sets of AND gates being respectively applied to first and second inputs of a set of OR gates whose outputs are applied to the first output of said at least one unit, and the output of said algebraic adder being applied to the second output of said at least one unit.

4. An inverse transforming processor for transforming N signals $c_i$, where $i = 1, N$ and $N = 2^n$, comprising ordering means for ordering the N signals $c_i$ into $n+1$ sets of signals, the first set comprising N/2 signals, the second set comprising N/4 signals, and so on, until a $n^{th}$ set comprising a single signal and a $n+1^{th}$ set also comprising a single signal, the signal of the $n+1^{th}$ set and the signal of the $n^{th}$ set being, in that order, applied to a first inverse transformation unit delivering a pair of first signals, which are each applied to second inverse transforming units belonging to a set of two second inverse transforming units together with respectively the two signals from the $n-1^{th}$ set of signals, the set of second inverse transforming units delivering four second signals, which are each applied to third inverse transforming units together with respectively the four signals from the $n-2^{th}$ set of signals, and so on, until a set of $n^{th}$ inverse transforming units delivering N final ordered signals, each either first, or second, . . . , or $n^{th}$ unit processing order signals $(c_i, c_j)$ according to the following logic relations:

$$a_i = c_i \text{ and sign of } c_j \text{ or } (c_i + c_j) \text{ and } \overline{\text{sign of } c_j} \quad (3)$$

$$a_j = (c_i - c_j) \text{ and sign of } c_j \text{ or } c_i \text{ and } \overline{\text{sign of } c_j} \quad (4)$$

and delivering ordered pair of signals $(a_i, a_j)$.

5. An inverse transforming processor according to claim 4, for transforming $N \times P$ signals $c_i^k$, where $i = 1, N$; $k = 1, P$; $N = 2^n$ and $P = 2^p$, into $N \times P$ signals $a_i^k$, comprising a first matrix memory, of N rows and P columns, storing said $N \times P$ signals, reading means for reading each row of signals $c_i^k$ from said first matrix memory and applying them to an inverse transforming processor delivering a column of signals $d_k^i$, ordering means for ordering said columns of signals $d_k^i$ into a second matrix memory of P rows and N columns, reading means for reading each row of signals $d_k^i$ from said second matrix memory and applying them to an inverse transforming processor delivering a column of signals $a_i^k$, and ordering means for ordering said columns of signals $a_i^k$ into a third matrix memory of N rows and P columns.

6. An inverse transforming processor according to claim 4, wherein at least one of said inverse transforming units includes first and second inputs, said first input receiving signal $(m)$ and said second input receiving signal $(D)$, said signal $(m)$ input being connected to both the first inputs of a first and a second set of AND gates and the first input of an algebraic adder, said signal $(D)$ input being connected to the input of a controlled sign changing circuit whose output is connected to the second input of said algebraic adder, the sign input of said sign changing circuit being connected to the control input of said sign changing circuit, to the second inputs of said first set of AND gates, to the first inputs of a third set of AND gates, and to the input of an inverter whose output is connected to second inputs of said second set of AND gates and the second inputs of a fourth set of AND gates, an output of said algebraic adder being connected to second inputs of said third set of AND gates and first inputs of said fourth set of AND gates, outputs of said first and fourth sets of AND gates being respectively connected to first and second inputs of a first set of OR gates, outputs of said second and third sets of AND gates being respectively connected to first and second inputs of a second set of OR gates, the changing of the second input sign by said controlled sign changing circuit being a function of the signal $(D)$ input sign condition, and said first and second sets of OR gates delivering signals $a'_i$ and $a'_j$.

* * * * *